(12) United States Patent
Rogers et al.

(10) Patent No.: US 7,002,352 B2
(45) Date of Patent: Feb. 21, 2006

(54) REFERENCE VOLTAGE DIAGNOSTIC SUITABLE FOR USE IN AN AUTOMOBILE CONTROLLER AND METHOD THEREFOR

(75) Inventors: Bruce A. Rogers, Novi, MI (US); Paul A. Bauerle, Fenton, MI (US); Vivek Mehta, Bloomfield Hills, MI (US); Cheryl A. Williams, Ann Arbor, MI (US)

(73) Assignee: General Motors Corporation, Detroit, MI (US)

( * ) Notice: Subject to any disclaimer, the term of this patent is extended or adjusted under 35 U.S.C. 154(b) by 70 days.

(21) Appl. No.: 10/602,912

(22) Filed: Jun. 24, 2003

(65) Prior Publication Data

US 2004/0263180 A1    Dec. 30, 2004

(51) Int. Cl.
  *G01R 31/08*    (2006.01)
(52) U.S. Cl. .................. 324/522; 324/72; 340/661
(58) Field of Classification Search ............. 324/522, 324/72; 340/661
  See application file for complete search history.

(56) References Cited

U.S. PATENT DOCUMENTS

| | | | |
|---|---|---|---|
| 3,663,958 A * | 5/1972 | Crane ...................... | 340/661 |
| 5,973,500 A * | 10/1999 | Moreau et al. ............ | 324/522 |
| 6,002,260 A * | 12/1999 | Lau et al. .................. | 324/522 |
| 6,456,086 B1 * | 9/2002 | Bolz et al. ................. | 324/522 |

\* cited by examiner

Primary Examiner—Vincent Q. Nguyen
Assistant Examiner—Timothy J. Dole
(74) Attorney, Agent, or Firm—Christopher DeVries

(57) ABSTRACT

A diagnostic apparatus is suitable for use in an automobile controller and includes a power supply terminal conducting a reference voltage, a sampling circuit and a reference voltage diagnostic circuit. The sampling circuit is coupled to the power supply terminal and has an output terminal for providing sampled values of the reference voltage. The reference voltage diagnostic circuit has an input terminal coupled to the output terminal of the sampling circuit. The reference voltage diagnostic circuit maintains a historical value of the reference voltage over a predetermined time period, compares a current sampled value of the reference voltage to the historical value, and indicates a fault in the reference voltage in response to the current sampled value being different from the historical value by more than a predetermined threshold.

18 Claims, 6 Drawing Sheets

REFERENCE VOLTAGE DIAGNOSTIC SUITABLE FOR USE IN AN AUTOMOBILE CONTROLLER AND METHOD THEREFOR

TECHNICAL FIELD

The present invention generally relates to voltage monitoring diagnostics, and more particularly relates to a reference voltage diagnostic suitable for use in an automobile controller such as a powertrain control module.

BACKGROUND

Automobile control systems are operated by electrical circuitry and sensors. For example, the powertrain control system receives inputs from several sensors that are processed in an electronic powertrain control module. The sensors and the circuitry in the powertrain control module are powered from a reference voltage that has a lower voltage than the battery voltage, for example, five volts.

The powertrain control module includes a microcontroller running an application program that controls the powertrain in response to the sensor inputs. The application program typically includes a diagnostic that is useful in detecting the failure of various components in the powertrain control system. Upon detecting a failure, the diagnostic stores one or more diagnostic error codes in a nonvolatile memory. The diagnostic error codes can later be read by a service technician and used as a basis for effecting repairs by replacing the faulty component or components.

A problem occurs when the failure is due to a loss of the reference voltage. Known reference voltage diagnostics compare the reference voltage to fixed high and low threshold values. In order to detect one possible reference voltage fault, in which the reference voltage line gets shorted to the higher battery voltage, it is necessary to scale the reference voltage to a lower value. This scaling can be accomplished by a resistor divider. However, the resistance of the resistors varies significantly over time as the temperature of the engine compartment varies. The circuit that samples the scaled value also suffers from errors and the reference voltage itself fluctuates over time. Thus, to accommodate all normal operating conditions over the life of the vehicle, the thresholds must be set to a wide range to avoid detecting false failures.

However, using these wide thresholds causes problems when the diagnostic does not detect real reference voltage failures quickly enough. If the reference voltage fails, other components may appear to be failing when the only reason they are failing is that their power supply voltage has failed. If the portion of the diagnostic that detects reference voltage failure is not sensitive enough, the failure may not be detected before the failure of other components is recorded. Thus, the service technician who reads the diagnostic error codes will be directed to the wrong problem, resulting in unnecessary service work, which is expensive and time consuming for the owner.

Accordingly, it is desirable to provide a new diagnostic that is able to detect a reference voltage failure more accurately and to report this failure by setting an appropriate diagnostic error code, while ignoring other consequential failures. This and other desirable features and characteristics of the present invention will become apparent from the subsequent detailed description of the invention and the appended claims, taken in conjunction with the accompanying drawings and this background of the invention.

BRIEF SUMMARY

A diagnostic apparatus suitable for use in an automobile controller includes a power supply terminal conducting a reference voltage, a sampling circuit, and a reference voltage diagnostic circuit. The sampling circuit is coupled to the power supply terminal and has an output terminal for providing sampled values of the reference voltage. The reference voltage diagnostic circuit has an input terminal coupled to the output terminal of the sampling circuit. The reference voltage diagnostic circuit maintains a historical value of the reference voltage over a predetermined time period, compares a current sampled value of the reference voltage to the historical value, and indicates a fault in the reference voltage in response to the current sampled value being different from the historical value by more than a predetermined threshold.

In another form a diagnostic apparatus suitable for use in an automobile controller includes first and second power supply terminals respectively conducting first and second reference voltages, a sampling circuit, and a reference voltage diagnostic circuit. The sampling circuit is coupled to the first and second power supply terminals and has an output terminal for providing sampled values of the first and second reference voltages. The reference voltage diagnostic circuit has an input terminal coupled to the output terminal of the sampling circuit. The reference voltage diagnostic circuit compares a sampled value of the first reference voltage to a sampled value of the second reference voltage, and indicates a fault in at least one of the first and second reference voltages in response a difference between the sampled value of the first reference voltage and the sampled value of the second reference voltage being greater than a predetermined threshold.

A method is also provided for diagnosing a fault of a reference voltage in an automobile controller or the like. A current value of the reference voltage is determined. The current value of the reference voltage is compared to a historical value of the reference voltage. If the current value is not within a predetermined threshold of the historical value, a fault in the reference voltage is indicated.

Another method is provided for diagnosing a fault in one of multiple reference voltages in an automobile controller or the like. Values of first and second reference voltages are determined. A difference between the first reference voltage and the second reference voltage is calculated. The difference is compared to a predetermined threshold. A fault in one of the first and second reference voltages is indicated if the difference is greater than the predetermined threshold.

BRIEF DESCRIPTION OF THE DRAWINGS

The present invention will hereinafter be described in conjunction with the following drawing figures, wherein like numerals denote like elements.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
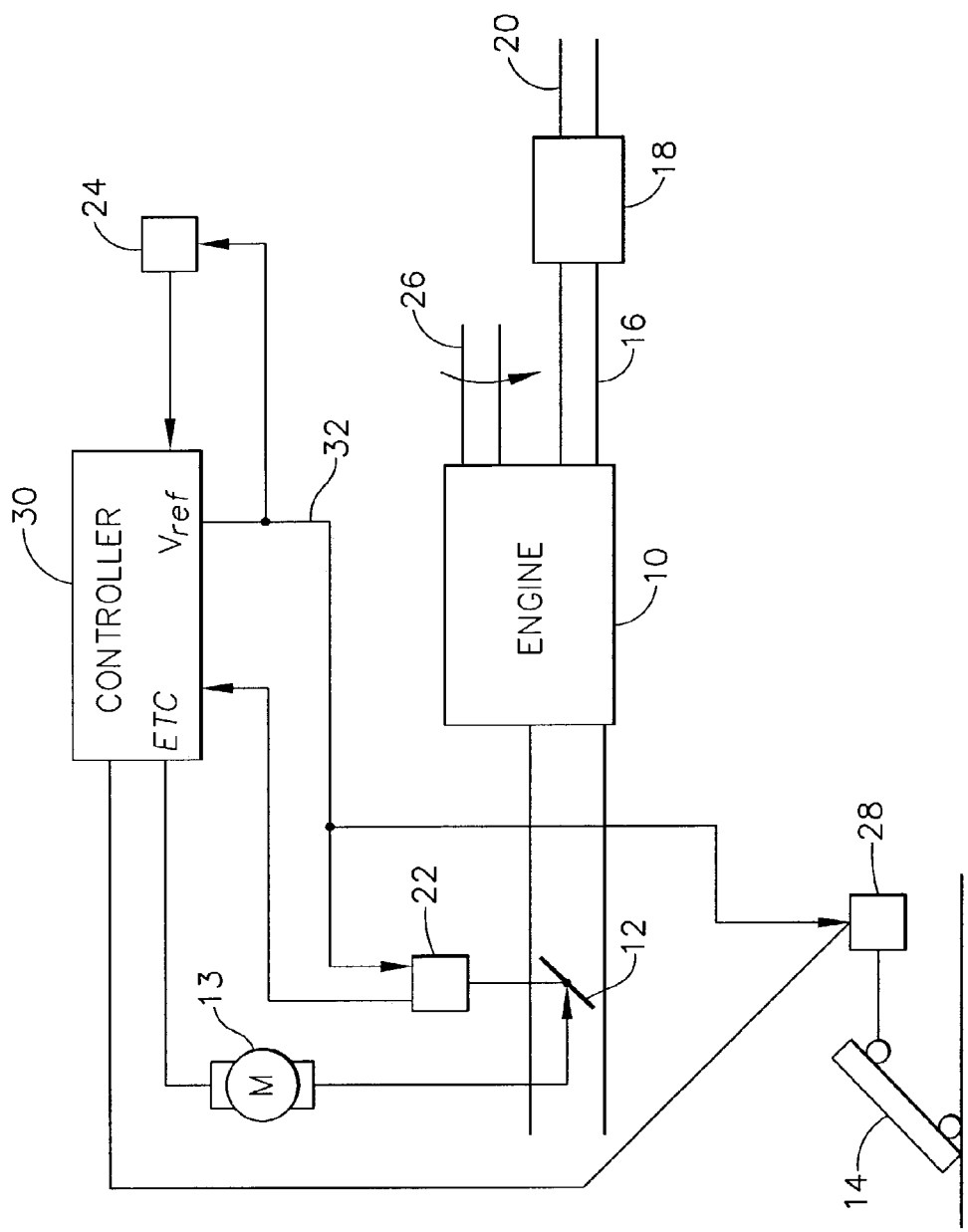
FIG. 1 illustrates a block diagram of a powertrain system utilizing a reference voltage diagnostic according to the present invention.

Referring now to FIG. 1, which illustrates a block diagram of a powertrain system utilizing a reference voltage diagnostic according to the present invention, air flows into an internal combustion engine 10 through an intake throttle blade 12, which throttle blade 12 is controlled by a throttle actuator 13. The air is combined into fuel air mixtures and burned in the engine cylinders (not shown). After the air is burned in the cylinders, the exhaust gas flows through an exhaust gas conduit 16 and a catalytic device 18, finally releasing into the atmosphere through a tail pipe 20. An accelerator pedal 14 is displaced in response to operator demand for engine output power. The accelerator pedal 14 could also take the form of a stick, such as that present in a vehicle equipped for operation by the handicapped.

Associated with the engine are various conventional sensors known in the art, which provide typical signals, related to engine control. Coupled to the throttle 12 is a throttle position sensor (TPS) 22. Vehicle speed is determined from a sensor (not shown) coupled through a flexible cable to the driveshaft 26, which rotates at an angular speed proportional to vehicle speed. The degree to which the accelerator pedal 14 is displaced in response to operator demand for engine output power is indicated by a pedal position sensor 28.

Engine controller 30 forms part of a powertrain control module and includes a conventional digital microcomputer used by those in the art for engine control. Controller 30 includes standard elements such as a central processing unit (CPU), random access memory, read-only memory, analog to digital converters, input/output circuitry, and clock circuitry. Controller 30 is activated upon application of ignition power to an engine 10. When activated, controller 30 carries out a series of operations stored in an instruction-by-instruction format in memory for providing engine control, diagnostic and maintenance operations. Signals from the previously mentioned sensors flow over the paths indicated in FIG. 1 and serve as inputs to controller 30. Using these inputs, controller 30 performs appropriate computations and outputs various signals. For example, controller 30 uses pedal position sensor 28 in an electronic throttle control algorithm to produce a signal, labeled "ETC", to control throttle actuator 13. When accelerator pedal 14 is displaced, the ETC signal directs throttle actuator 13 to increase the angle of throttle 12, allowing more air into the engine and thereby increasing engine power.

Controller 30 also provides a reference voltage labeled "$V_{ref}$" to each of sensors 22, 24, and 28 via a power supply line 32. Sensor 24 represents one of many other possible sensors connected to controller 30 that is supplied with $V_{ref}$. During operation of the vehicle, there may be a fault such that $V_{ref}$ is corrupted. For example, power supply line 32 may be shorted to ground or to the battery voltage, resulting in values of around zero volts and twelve volts respectively appearing on power supply line 32. According to the present invention, controller 30 includes a diagnostic portion of its application program that is able to detect such faults on power supply line 32 so that controller 30 can set the appropriate diagnostic error codes, as will be explained in greater detail below.

Figure 2:
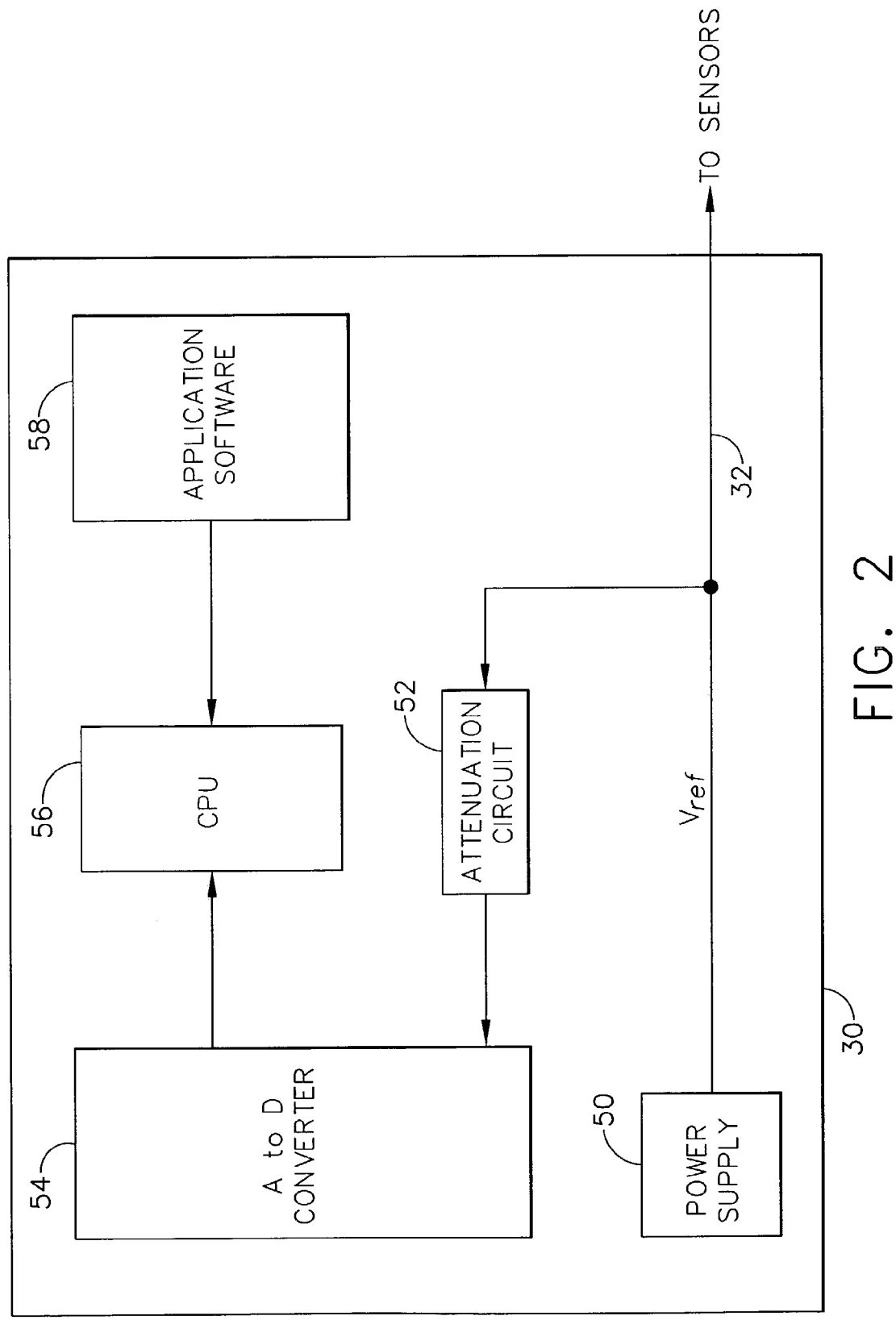
FIG. 2 illustrates in block diagram form the controller of FIG. 1.

FIG. 2 illustrates in block diagram form controller 30 of FIG. 1. Controller 30 includes conventional components but only the components relevant to understanding the present invention are shown in FIG. 2. Thus controller 30 is illustrated as having a power supply block 50, an attenuation circuit 52, an analog to digital (A-to-D) converter 54, a central processing unit 56, and a memory 58 storing an application software program. Power supply 50 is responsive to a source of operating power such as the ignition system or car battery and provides operating power to the modules in controller 30. One of these voltages is $V_{ref}$, which is provided to the external sensors on power supply line 32. Power supply line 32 is also connected to an input of an attenuation circuit 52. Attenuation circuit 52 provides a scaled version of $V_{ref}$ to an output terminal thereof. Attenuation circuit 52 includes a resistor divider, not shown, to place the scaled version of $V_{ref}$ in the center of the operating range of A-to-D converter 54 when $V_{ref}$ is at its nominal value of five volts. By such scaling A-to-D converter 54 is able to detect when $V_{ref}$ exceeds its nominal 5-volt value. A-to-D converter 54 periodically provides output digital samples corresponding to the analog value of the scaled version of $V_{ref}$ to CPU 56. CPU 56 runs the application software stored in memory 58 and operates in conjunction with the application software to form a diagnostic circuit. This application software includes a diagnostic that detects failures in $V_{ref}$ that will be described more fully with reference to FIG. 4 below.

Figure 3:
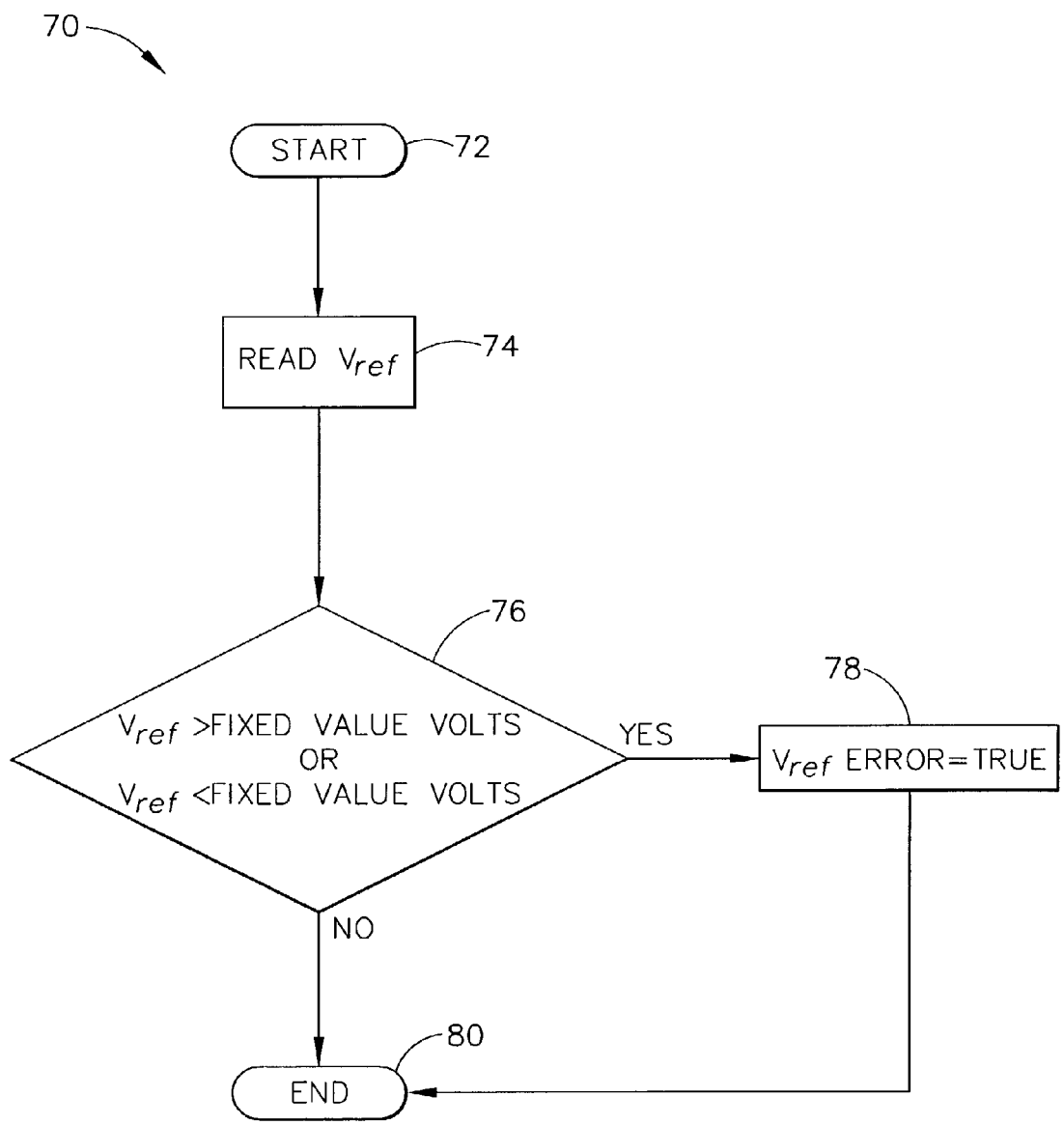
FIG. 3 is a flow chart of a reference voltage diagnostic that may be used with controller 30 of FIG. 2 known in the prior art.

FIG. 3 is a flow chart of a reference voltage diagnostic 70 known in the prior art. Diagnostic 70 is run periodically, and after starting at step 72 it reads the value of $V_{ref}$ from the output of A-to-D converter 54 at step 74. Then at step 76 it determines whether $V_{ref}$ is greater than a first fixed value or less than a second fixed value. For example, the upper limit may be 5.5 volts and the lower limit 4.5 volts. If the answer to the conditional is YES, then it sets a diagnostic error code labeled "$V_{ref}$ ERROR" to TRUE at step 78 and the routine terminates at step 80. Otherwise, if the answer to the conditional is NO, the routine terminates at step 80 without setting $V_{ref}$ ERROR to TRUE.

The allowable range for $V_{ref}$ is relatively large to compensate for errors in the system's ability to measure the true value of $V_{ref}$. There are several sources of error, including the A-to-D converter; changes in the electrical properties of the attenuation circuit over time and temperature, and the normal fluctuation in $V_{ref}$ itself. The threshold must accommodate all operating conditions over the life of the vehicle. As a result, the thresholds are set widely to prevent falsely setting $V_{ref}$ ERROR to TRUE. This wide range of thresholds can result in falsely reported sensor failures resulting in unnecessary service work to replace the sensors as discussed above.

However, according to the present invention, the reference voltage diagnostic doesn't measure the absolute value of the reference voltage but rather looks for a sudden change in the voltage level over its historical value. Such a sudden change cannot be accounted for by changes in temperature since engine heating affects the properties of the components slowly compared to the frequency with which the historical value is maintained. Thus, the diagnostic can detect faults in the power supply voltage while ignoring changes caused only by normal variations in operating conditions such as increases in temperature and normal inaccuracies in the components used to measure the voltage. In addition this more accurate measurement allows the reference voltage diagnostic to detect when the inputs from other sensors will not be accurate, preventing erroneous failure reports.

Figure 4:
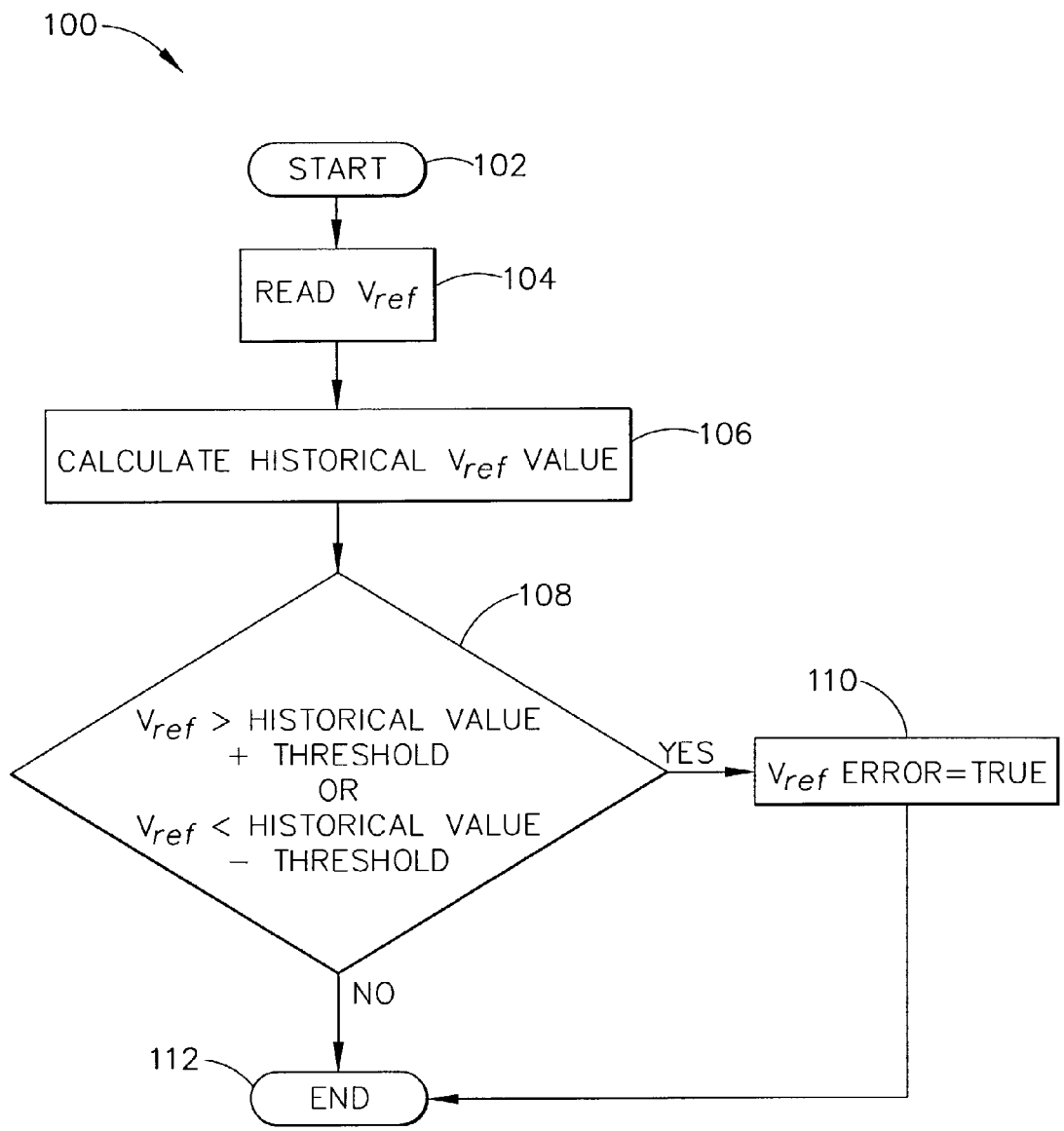
FIG. 4 is a flow chart of a reference voltage diagnostic that may be used in the controller of FIG. 2 according to the present invention.

This reference voltage diagnostic can be better understood with reference to FIG. 4, which is a flow chart of a reference voltage diagnostic 100 used in controller 30 of FIGS. 1 and 2. Diagnostic 100 is also run periodically and after starting at step 102, and reads the current sampled value of $V_{ref}$ from the output of A-to-D converter 54 at step 104. In step 106 it calculates a new historical value of $V_{ref}$ by factoring in the new sample. In one embodiment the historical value is formed with a first order lag filter. Using the first order lag filter causes the historical value to be formed by a smoothing factor β times the previous historical value of $V_{ref}$ plus the quantity one minus β times the current sampled value of $V_{ref}$. β is chosen appropriately to select the desired degree of responsiveness or alternatively the desired degree of hysteresis. Thus the first order lag filter includes a history of all prior samples. Alternatively other types of historical values can be calculated. For example the historical value may be calculated as a linear average of a certain number of the preceding samples of $V_{ref}$.

After the historical value is formed step 108 determines whether the current sampled value of $V_{ref}$ is greater than the historical value plus a predetermined threshold, or less than the historical value minus the predetermined threshold. Note that in the illustrated embodiment the thresholds used for positive and negative deviation are the same, but in other embodiments different threshold values may be used. The frequency with which the reference voltage diagnostic is run is so fast that the deviation from the historical value due to heating and normal variation in the other components will be small, and any larger deviation can validly be interpreted as a $V_{ref}$ error. Thus, if the answer to the conditional is YES, then the diagnostic sets $V_{ref}$ ERROR to TRUE at step 110 by storing an appropriate diagnostic error code in nonvolatile memory in controller 30, and the routine terminates at step 112. Otherwise, if the answer to the conditional is NO, then the routine terminates at step 112 without setting $V_{ref}$ ERROR to TRUE.

This new diagnostic allows for setting thresholds more tightly. Actual reference voltage failures, such as shorting power supply line 32 to ground or to the battery voltage, will have a time constant on the order of tens of microseconds and will be detected by the diagnostic program before it detects the other sensors failing. Thus, the diagnostic provides more accurate fault detection.

Figure 5:
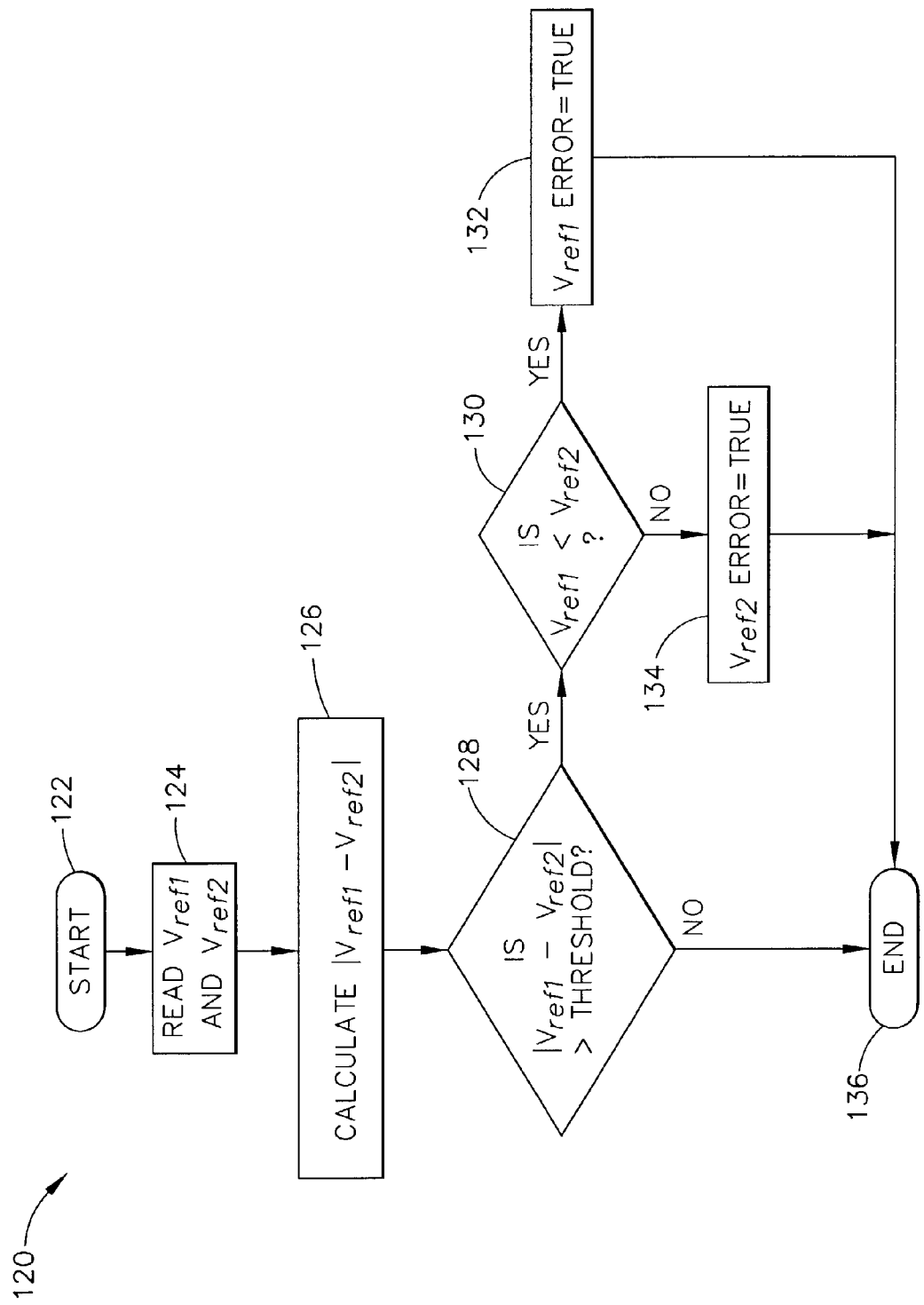
FIG. 5 is a flow chart of a second reference voltage diagnostic according to the present invention.
Figure 6:
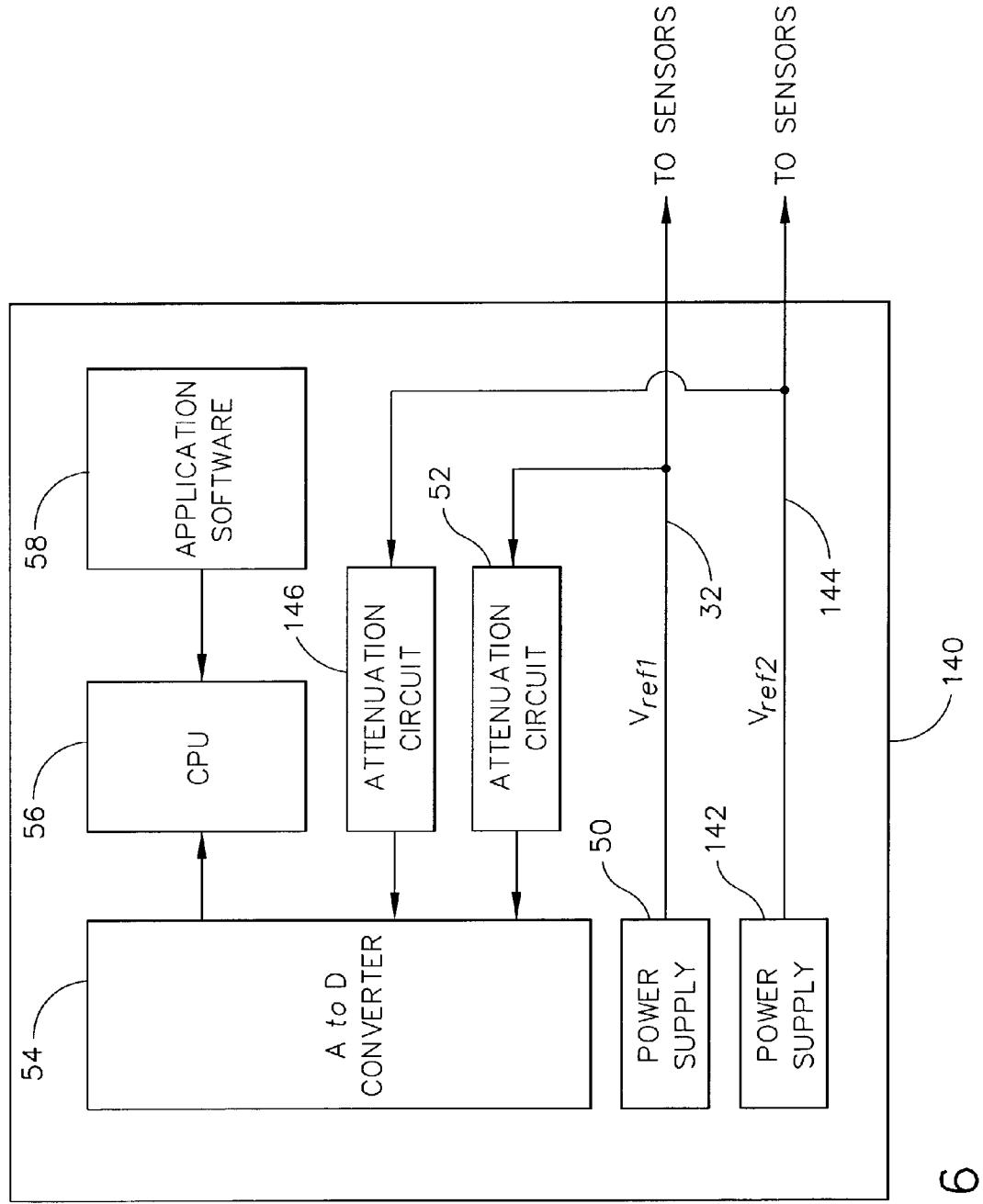
FIG. 6 is a block diagram of a modified controller for use with the reference voltage diagnostic of FIG. 5.

FIG. 5 is a flow chart of a second reference voltage diagnostic 120 according to the present invention. Reference voltage diagnostic 120 is useful in a system that generates two reference voltages, labeled "$V_{ref1}$" and "$V_{ref2}$". Now referring to FIG. 6, a modified controller 140 having two power supplies for use with reference voltage diagnostic 120 of FIG. 6 is shown. Controller 140 includes an additional power supply 142 providing reference voltage $V_{ref2}$ and an additional attenuation circuit 146 whose output is provided to another input of A-to-D converter 54. Other features remain the same as in FIG. 3. The different reference voltages could be provided in any combination to sensors 22, 24, and 28 or other sensors which may be present in the powertrain system shown in FIG. 1.

Returning to FIG. 5, reference voltage diagnostic 120 is run periodically and after starting at step 122, reads the current sampled values of $V_{ref1}$ and $V_{ref2}$ from outputs of the A-to-D converter at step 124. At step 126 it calculates difference between the two reference voltages by determining the absolute value of $V_{ref1}-V_{ref2}$ ($|V_{ref1}-V_{ref2}|$), and compares this quantity to a threshold at step 128. If this quantity does not exceed the threshold, then the diagnostic ends at step 136. If however this quantity exceeds the threshold, then the reference voltage diagnostic determines that one of the power supplies has encountered a fault. The next step is to determine which power supply has been subject to a fault.

At step 130, the reference voltage diagnostic compares $V_{ref1}$ and $V_{ref2}$. The lower of the two values is assumed to represent the faulted supply. Thus if $V_{ref1}<V_{ref2}$, then at step 132 a diagnostic error code known as $V_{ref1}$ ERROR is set to TRUE. Alternatively if $V_{ref1}>V_{ref2}$, then at step 134 a diagnostic error code known as $V_{ref2}$ ERROR is set to TRUE. The voltage reference diagnostic then ends at step 136.

Note that diagnostic 120 will report an erroneous result if one of the power supplies is shorted to the battery. However, the short-to-battery fault is much less common than the short-to-ground fault, and is believed to be about three orders of magnitude less common for a typical automobile environment. Furthermore reference voltage diagnostic 120 could be used in conjunction with known diagnostic 70 of FIG. 3. In this case reference voltage diagnostic 70 would set an out-of-range high code, causing both diagnostic error codes to be set. Furthermore other software already captures the voltages when the error codes are set so the service technician will be able to see which one is out of range. The captured voltage in the short-to-battery case would be about 5.5 volts since the maximum scaled value is 5.5 volts. Alternatively diagnostic 120 could be disabled if one of the reference voltages is currently out of range high, allowing only the correct code to be logged.

Reference voltage diagnostic 120 provides a fast indicator of a power supply fault by using the information contained in the other power supply as a reference. As heating occurs the components used to generate $V_{ref1}$ will tend to drift by about the same amount as those used to generate $V_{ref2}$. Thus over expected operating conditions $V_{ref1}$ will tend to track $V_{ref2}$. Any difference greater than the threshold will likely be the result of a fault rather than normal variation over operating conditions. Furthermore $V_{ref1}$ and $V_{ref2}$ need not have the same nominal values, but can be compared to each other as long as their respective attenuation circuits cause the corresponding scaled values to nominally be the same.

It should be noted that the reference voltage diagnostic disclosed herein is applicable to other automobile modules beside the powertrain control module, such as the engine control module. It may also be used in non-automotive systems that require diagnostic checking and/or reporting and that route power supply voltages to various devices. The controller may be part of a larger system or it, may only function as a diagnostic circuit. In other embodiments the diagnostic could perform the same function that is performed by the CPU running the diagnostic portion of the application software. In the illustrated embodiments, controllers 30 and 140 indicate the reference voltage fault by setting a diagnostic error code and storing the diagnostic error code in a nonvolatile memory from which it can later be read by a service technician. However the diagnostic may use other techniques to indicate the reference voltage fault, such as activation of a signal on a signal line.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map, for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A diagnostic apparatus suitable for use in an automobile controller comprising:
   a power supply terminal conducting a reference voltage;
   a sampling circuit coupled to said power supply terminal and having an output terminal for providing sampled values of said reference voltage; and
   a reference voltage diagnostic circuit having an input terminal coupled to said output terminal of said sampling circuit, wherein said reference voltage diagnostic circuit maintains a historical value of said reference voltage over a predetermined time period, compares a current sampled value of said reference voltage to said historical value, and indicates a fault in said reference voltage in response to said current sampled value being different from said historical value by more than a predetermined threshold.

2. The diagnostic apparatus of claim 1 wherein said sampling circuit comprises:
   an attenuation circuit having an input terminal coupled to said power supply terminal for receiving said reference voltage, and an output terminal for providing a scaled reference voltage; and
   an analog-to-digital converter having an input terminal coupled to said output terminal of said attenuation circuit, and an output terminal for providing said current sample of said reference voltage.

3. The diagnostic apparatus of claim 1 wherein said reference voltage diagnostic circuit indicates said fault by storing a diagnostic error code in a memory location.

4. The diagnostic apparatus of claim 1 wherein said reference voltage diagnostic circuit comprises:
   a central processing unit coupled to said output terminal of said sampling circuit; and
   a memory coupled to said central processing unit for storing an application program having a reference voltage diagnostic, associated therewith which selectively indicates said fault in said reference voltage.

5. The diagnostic apparatus of claim 1 wherein said reference voltage diagnostic circuit updates said historical value based on said current sampled value using a first order lag filter.

6. The diagnostic apparatus of claim 1 further comprising a power supply for providing said reference voltage to said power supply terminal.

7. The diagnostic apparatus of claim 1 wherein said reference voltage diagnostic circuit indicates said fault in said reference voltage in response to either said current sampled value being greater than said historical value by more than a first predetermined threshold or by said current sampled value being less than said historical value by more than a second predetermined threshold.

8. A diagnostic apparatus suitable for use in an automobile controller comprising:
   first and second power supply terminals respectively conducting first and second reference voltages;
   a digital sampling circuit coupled to said first and second power supply terminals and having an output terminal for providing sampled digital values of said first and second reference voltages; and
   a reference voltage diagnostic circuit having an input terminal coupled to said output terminal of said sampling circuit, wherein said reference voltage diagnostic circuit compares a sampled value of said first reference voltage to a sampled value of said second reference voltage, and indicates a fault in at least one of said first and second reference voltages in response to a difference between said sampled value of said first reference voltage and said sampled value of said second reference voltage being greater than a predetermined threshold.

9. The diagnostic apparatus of claim 8 wherein said digital sampling circuit comprises:
   a first attenuation circuit having an input terminal coupled to said first power supply terminal for receiving the first reference voltage, and an output terminal for providing a scaled first reference voltage;
   a second attenuation circuit having an input terminal coupled to said second power supply terminal for receiving the second reference voltage, and an output terminal for providing a scaled second reference voltage; and
   an analog-to-digital converter having a first input terminal coupled to said output terminal of said first attenuation circuit, having a second input terminal coupled to said output terminal of said second attenuation circuit, and an output terminal coupled to said input terminal of said reference voltage diagnostic circuit.

10. The diagnostic apparatus of claim 8 wherein said reference voltage diagnostic circuit indicates said fault by storing a diagnostic error code in a memory location.

11. The diagnostic apparatus of claim 8 wherein said reference voltage diagnostic circuit comprises:
    a central processing unit coupled to said output terminal of said sampling circuit; and
    a memory coupled to said central processing unit for storing an application program having a reference voltage diagnostic associated therewith which selectively indicates said fault in the first and second reference voltages.

12. The diagnostic apparatus of claim 8 further comprising first and second power supplies for providing said first and second reference voltages respectively to said first and second power supply terminals.

13. A method of diagnosing a fault of a reference voltage in a vehicle controller, comprising the steps of:
    determining a current value of said reference voltage;
    comparing said current value of said reference voltage to a historical value of said reference voltage; and
    indicating a fault in said reference voltage if said current value is not within a predetermined threshold of the historical value;
    wherein said step of determining said current value of said reference voltage comprises the steps of:
      scaling said reference voltage to provide a scaled reference voltage; and
      converting said scaled reference voltage to a digital signal in an analog-to-digital converter.

14. The method of claim 13 further comprising the step of calculating said historical value using said current value.

15. A method of diagnosing a fault of a reference voltage in a vehicle controller, comprising the steps of:
    determining a current value of said reference voltage;
    calculating a historical value using said current value;

comparing said current value of said reference voltage to said historical value of said reference voltage; and indicating a fault in said reference voltage if said current value is not within a predetermined threshold of the historical value;

wherein said step of calculating said historical value based on said current value comprises the step of calculating said historical value based on said current value using a first order lag filter.

16. A method of diagnosing a fault of a reference voltage in a vehicle controller, comprising the steps of:

determining said current value of said reference voltage;

calculating a historical value using said current value;

comparing said current value of said reference voltage to said historical value of said reference voltage; and indicating a fault in said reference voltage if said current value is not within a predetermined threshold of the historical value;

wherein said step of calculating said historical value based on said current value comprises the step of averaging all current values over a predetermined time period.

17. A method of diagnosing a fault in one of multiple reference voltages in a vehicle controller, comprising the steps of:

determining values of first and second reference voltages;

calculating a difference between said first reference voltage and said second reference voltage;

comparing said difference to a predetermined threshold; and indicating a fault in one of said first and second reference voltages if said difference is greater than said predetermined threshold;

wherein said step of determining said values of said first and second reference voltages comprises the steps of:

scaling said first reference voltage to provide a scaled first reference voltage;

scaling said second reference voltage to provide a scaled second reference voltage; and converting said scaled first reference voltage and said scaled second reference voltage to corresponding digital signals in an analog-to-digital converter.

18. The method of claim 17 wherein said step of indicating comprises the steps of:

determining a smaller one of said first and second reference voltages; and setting an error flag corresponding to said smaller one of said first and second reference voltages.

* * * * *